United States Patent
Ramos Murillo et al.

(10) Patent No.: US 10,727,428 B1
(45) Date of Patent: Jul. 28, 2020

(54) ORGANIC-SEMICONDUCTING HYBRID SOLAR CELL

(71) Applicants: Universidad Autonoma de Ciudad Juarez, Ciudad Juarez (MX); National Technology & Engineering Solutions of Sandia, LLC, Albuquerque, NM (US)

(72) Inventors: Manuel Antonio Ramos Murillo, Cd Juarez (MX); John Joseph Nogan, NW Albuquerque, NM (US); Roberto Carlos Ambrosio Lazaro, San Pedro Cholula (MX); Claudia Alejandra Rodriguez González, Cd Juarez (MX); Manuela Ortiz Diaz, Cd Juarez (MX); Jose Luis Enriquez-Carrejo, Cd Juarez (MX); Jose Mireles Jr. Garcia, Cd. Juarez (MX)

(73) Assignees: NATIOINAL TECHNOLOGY & ENGINEERING SOLUTIONS OF SA, Albuquerque, NM (US); UNIVERSIDAD AUTONOMA DE CIUDAD JUAREZ, Ciudad Juarez (MX)

( * ) Notice: Subject to any disclaimer, the term of this patent is extended or adjusted under 35 U.S.C. 154(b) by 0 days.

(21) Appl. No.: 16/265,577

(22) Filed: Feb. 1, 2019

(51) Int. Cl.
*H01L 51/42* (2006.01)
*H01L 51/44* (2006.01)
(Continued)

(52) U.S. Cl.
CPC .... *H01L 51/4213* (2013.01); *H01L 21/02568* (2013.01); *H01L 51/0045* (2013.01); *H01L 51/442* (2013.01); *Y02E 10/542* (2013.01)

(58) Field of Classification Search
CPC ................... H01L 51/4213; H01L 51/442
See application file for complete search history.

(56) References Cited

U.S. PATENT DOCUMENTS

| 5,296,130 A * | 3/1994 | Kriz .............. C10G 47/26 208/107 |
| 8,389,853 B2 * | 3/2013 | Chianelli .......... B82Y 10/00 136/243 |

(Continued)

OTHER PUBLICATIONS

C. Liu et al., Facile synthesis of MoS2/graphene nanocomposite with high catalytic activity toward triiodide reduction in dye-sensitized solar cells, Sep. 4, 2012, J. Mat. Chem., vol. 22, pp. 21057-21064, all page. (Year: 2012).*

(Continued)

*Primary Examiner* — Victoria K. Hall
(74) *Attorney, Agent, or Firm* — Abelman, Frayne & Schwab; Stefan Knirr

(57) ABSTRACT

The embodiment of this invention lies on experimental evidence of photoconductivity activity of a hybrid solar cell, organic/chalcogenide. The device is made of thin layers of conductive indium-tin-oxide (ITO) on glass with a 100 nm layer of chalcogenide molybdenum di-sulfide (MoS2) and a thin layer of about ~50 nm of complex organic compound assembled at room temperature. The device was tested to conventional electrical transport measurements in the regime of −1V to 1V under electromagnetic radiation simulator at 100 mW/cm2. Results indicate solar conversion efficiency of 2.48% and current density of 6.35 mA/cm2.

5 Claims, 2 Drawing Sheets

(51) Int. Cl.
*H01L 21/02* (2006.01)
*H01L 51/00* (2006.01)

(56) References Cited

U.S. PATENT DOCUMENTS

| | | | | |
|---|---|---|---|---|
| 8,748,740 B2* | 6/2014 | Chianelli | ............... | B82Y 10/00 136/243 |
| 9,065,059 B2* | 6/2015 | Dilabio | ................ | B82Y 10/00 |
| 9,293,266 B2* | 3/2016 | Chianelli | ............... | B82Y 10/00 |
| 9,862,609 B2* | 1/2018 | Deemer | ................ | H01B 1/04 |
| 2001/0014420 A1* | 8/2001 | Takeuchi | ................ | B32B 7/02 429/209 |
| 2001/0026890 A1* | 10/2001 | Ono | ..................... | H01G 9/2009 429/189 |
| 2002/0034685 A1* | 3/2002 | Sato | ................... | H01M 2/0267 429/176 |
| 2002/0034690 A1* | 3/2002 | Ono | ....................... | C09K 19/00 429/306 |
| 2009/0114272 A1* | 5/2009 | Inoue | ....................... | C09K 3/10 136/252 |
| 2009/0250104 A1* | 10/2009 | Inoue | ....................... | H01G 9/2031 136/256 |
| 2011/0005589 A1* | 1/2011 | Chianelli | ............... | B82Y 10/00 136/256 |
| 2011/0088756 A1* | 4/2011 | Fujii | .......................... | C09J 7/10 136/251 |
| 2011/0269010 A1* | 11/2011 | Sawaguchi | ........... | C23C 16/405 429/144 |
| 2012/0090683 A1* | 4/2012 | Uzoh | ..................... | H01L 31/056 136/260 |
| 2012/0141878 A1* | 6/2012 | Ohashi | ............... | H01M 10/0567 429/300 |
| 2013/0087203 A1* | 4/2013 | Tani | ...................... | C07D 213/79 136/263 |
| 2013/0202354 A1* | 8/2013 | Chianelli | ............... | B82Y 10/00 404/17 |
| 2014/0121425 A1* | 5/2014 | Worsley | ................ | B01J 27/051 585/240 |
| 2014/0234026 A1* | 8/2014 | Chianelli | ............... | B82Y 10/00 404/17 |
| 2015/0122314 A1* | 5/2015 | Snaith | ................ | H01L 51/4213 136/255 |
| 2015/0129034 A1* | 5/2015 | Snaith | ................ | H01L 51/4226 136/258 |
| 2015/0136232 A1* | 5/2015 | Snaith | ................ | H01L 51/0077 136/263 |
| 2015/0144195 A1* | 5/2015 | Irwin | .................... | H01L 51/422 136/260 |
| 2015/0144198 A1* | 5/2015 | Irwin | .................... | H01G 9/2059 136/263 |
| 2017/0033299 A1* | 2/2017 | Satou | .................... | H01G 9/2031 |
| 2017/0110722 A1* | 4/2017 | Lee | ..................... | H01M 4/0404 |
| 2017/0125713 A1* | 5/2017 | Tokuda | ................ | H01L 51/444 |
| 2017/0174825 A1* | 6/2017 | Nelson | ................ | H01L 51/0043 |
| 2017/0372847 A1* | 12/2017 | Satou | ........................ | H01G 9/20 |
| 2018/0053863 A1* | 2/2018 | Tanaka | ................. | H01L 51/441 |
| 2018/0096798 A1* | 4/2018 | Satou | ................ | H01L 51/442 |
| 2018/0102481 A1* | 4/2018 | King | ................ | C08G 61/122 |
| 2018/0182506 A1* | 6/2018 | Gao | ........................ | H05K 1/095 |
| 2018/0197688 A1* | 7/2018 | Horiuchi | ............... | H01L 51/006 |
| 2018/0301288 A1* | 10/2018 | Irwin | ................ | H01G 9/2018 |
| 2018/0330890 A1* | 11/2018 | Tanaka | ................ | H01L 51/4273 |
| 2019/0237672 A1* | 8/2019 | Mitchell | ............... | C08G 61/126 |
| 2020/0017765 A1* | 1/2020 | Kim | ................ | G02F 1/133617 |
| 2020/0052227 A1* | 2/2020 | Morse | ................ | H01L 51/0069 |
| 2020/0066998 A1* | 2/2020 | Morse | ................ | H01L 51/0058 |

OTHER PUBLICATIONS

M. Shanmugam et al., Molybdenum disulphide/titanium dioxide nanocomposite-poly 3-hexylthiophene bulk heterojunction solar cell, Apr. 10, 2012, App. Physics. Letters, No. 100, pp. 153901-1 to 153901-4, all pages. (Year: 2012).*

N. Barreau & J. Bernede, MoS2 textured films grown on glass substrates through sodium sulfide based compounds, May 21, 2002, J. Physics D: Applied Physics, vol. 35, pp. 1197-1204. (Year: 2002).*

S. Tai et al., Few-layer MoS2 nanosheets coated onto multi-walled carbon nanotubes as a low-cost and highly electrocatalytic counter electrode for dye-sensitzied solar cells, Sep. 26, 2012, J. Mat. Chem., vol. 22, pp. 24753-24759. (Year: 2012).*

* cited by examiner

ORGANIC-SEMICONDUCTING HYBRID SOLAR CELL

STATEMENT OF GOVERNMENT INTEREST

The U.S. Government has rights in this invention pursuant to User Agreement UNPUA No. 1177 07 2016 between Universidad Autónoma de Ciudad Juárez and National Technology & Engineering Solutions of Sandia, LLC, which manages and operates Sandia National Laboratories for the U.S. Department of Energy/National Nuclear Security Administration, under Contract No. DE-NA0003525.

FIELD OF INVENTION

The chalcogenides are a series of chemical compounds that contain an anion formed by an ampigen element (Group 16) and a metal element of electropositive character. Molybdenum disulfide ($MoS_2$) is a crystalline inorganic chemical compound of sulfur and molybdenum and has a laminar hexagonal structure similar to graphene.

The present invention relates to a solar cell made of layers including a first layer of amorphous glass substrate, a first layer of conductive indium-tin-oxide (ITO) on the first layer of glass, a layer of chalcogenide semiconductor on the first layer of indium-tin-oxide, a layer of complex organic material disposed on the chalcogenide layer, a second layer of indium-tin-oxide disposed on the layer of organic material, and a second layer of amorphous glass substrate disposed on the second layer of indium-tin-oxide; This solar cell is capable of producing photoactivity under electromagnetic radiation of 100 $mW/cm^2$ with an efficiency of 2.48% and a current density of 6.35 $mA/cm^2$.

RELATED ART

In the past two decades has occurred an increase for searching of materials that allows electrical transport conductivity and its usage in diverse energy applications has brought discovery of different organic compounds to beyond conventional metals. One of purposes of the world energy quest is to find attractive materials that can be recycled or consider waste from other chemical engineering processes; this has led to deep chemical understanding of complex organic molecules and its derivatives. The silicon-based photovoltaic panels, electrical storage batteries and other transport microscale devices capable to transform power sources has reach their limit on capacity, meaning efficiency, size to capacity ratio, manufacture cost, among other technical issues. Organometallic compounds have become more attractive in the quest to replace conventional semiconducting and transport materials, due to its low cost, but in occasion there is a lack of chemical stability at temperatures above water boiling point (100° C.), however this has not deviate the research and efforts for deep understanding and chemical parity with other more stable materials, in arrays common named as layered hetero-junctions or dye sensitized films.

Conventional electrical transport in bulk metals is comprised as a continuous anisotropic flow of electrons along atomistic matrix in based centered cubic (BCC) or face centered cubic (FCC) having always a source and electrical contacts, the relation that determines a "poor" or "good" is given by a conventional linear formula known as ohm law, mathematically stated as V α I due to intrinsic resistance of metallic conductor matrix. A semiconductor is defined by a band gap on the electronic structure between valence and conduction bands near Fermi level. Silicon and Germanium earth chemical elements which belong to group IV have values in the range 0.66 to 1.2 eV at room temperature (25° C.) and chemical stability, their atomistic packing are diamond and cubic close-packed respectively; and in the majority of high temperature applications are combined to achieve high chemical stability and a band gap up to 1.8 eV as confirmed by both theoretical and experimental approaches. Molybdenum di-sulfide is a layer of chalcogenide materials which has both chemical stability at room and high temperatures above water boiling point (100° C.) and band gap in range of 1.6-2.2 eV as confirmed by theoretical and experimental estimations, and has brought much attention for potential as low dimension semiconductor for dye sensitized photovoltaic and electric transport applications, and its chemical stability when combined with organic materials.

Nowadays, they are well known, hybrid solar cells that incorporate layers of organic and inorganic material, and even compositions of organic and inorganic materials, most of which use materials such as indium tin oxide arranged on a glass substrate, however said state-of-the-art solar cells incorporate expensive metals and contaminants such as gold, silver or copper, and said cells are of complex manufacture, and none of said documents incorporate a layer of organic product, such as a thin layer of about ~50 nm of complex organic compound solid black paste integrated by complex aromatic asphaltene-like molecules, said organic layer composed by complex aromatic carbon graphitic-like, in contact with a chalcogenide layer, specifically an layer of 100 nm of chalcogenide molybdenum di-sulfide ($MoS_2$). This specific combination of layers increases the efficiency of the electromagnetic radiation.

Some of the documents that are within the state of the art are CN105161625 which provides a method for manufacturing a cuprous oxide heterojunction solar cell depositing a p-type layer on indium tin oxide (ITO) conductive glass by adopting an ultrasonic spraying method, depositing a CH3NH3PbI3 layer with an organic and inorganic hybrid perovskite structure as an n-type layer by adopting the ultrasonic spraying, and depositing a metal electrode layer on the n-type layer.

The document CN102881829 discloses an inorganic/organic hybrid solar cells. The device comprises a glass substrate, a cathode indium tin oxide (ITO), a cathode modification layer titanium dioxide or zinc oxide, an active layer formed by mixing mercaptoethylamine modified semiconductor nanocrystals (cadmium telluride, copper selenide or cadmium mercury telluride and the like) and polymer (poly(naphthyl acetylene) and the like), an anode modification layer molybdenum oxide, tungsten oxide, nickel oxide or poly(3,4-ethylenedioxythiophene) (PEDOT) and polysaccharide sulphate (PSS), and an anode Al, Au, Cu or Ag and the like from bottom to top in sequence.

GR1003816 discloses a photoelectrochemical solid type cell. The principal parts of the cell are a small glass plate coated with a thin hymenium of Indium-Tin Oxide (ITO); a layer of Titanium oxide ($TiO_2$) with a mean porous nanocrystal structure of the type of anatase in the form of a thin transparent hymenium of a selected thickness which is produced through a process of molecular moulds as described above; an adsorbed layer of an organometallic derivative of trispyridine of ruthenium which acts as a photo-sensitizer of $TiO_2$; a solid electrode layer consisting of a hybrid organic/inorganic polymer impregnated in I2/KI produced by conversion of a colloid solution into a gel as described above and; a second ITO plate which is the second electrode which completes the cell.

JP2017175019 refers a solar cell which includes a glass substrate, a resin substrate, or a metal foil that is provided with an electrode; a photoelectric conversion layer; and a first electron transport layer disposed between the photoelectric conversion layer and the glass substrate, the resin substrate, or the metal foil that is provided with the electrode. The photoelectric layer contains an organic inorganic perovskite compound expressed by R-M-X (R is an organic molecule, M is metal, and X is a halogen atom or a chalcogen atom).

SUMMARY OF THE INVENTION

In lieu of above-mentioned background, this invention is presented to provide evidence of photovoltaic activity on a device composed a thin layer of semiconducting chalcogenide material and a thin layer of complex organic molecules type asphaltenes, aromatics, benzenes. The device was tested by direct exposure to electromagnetic radiation (100 mW/cm$^2$) on a sun simulator laboratory station and measured by bias voltage from −0.2 to 0.5 volts using micromanipulators for contact to the thin films without any metal contact present. The evidence of photo-conduction is proved by experimental of (current-voltage) I-V curves obtained using an electrometer model Keithley 6517A® for all devices fabricated and tested under same otherwise conditions. The instruments were previously calibrated in accordance to manufacture requirements in accordance to IEEE-488.2 standard norm.

The invention, as presented herein, describes a organic-semiconducting hybrid solar cell, which as the final product is composed of an first layer of amorphous glass substrate (1), a first layer of conductive indium-tin-oxide (ITO) (2), disposed on first layer of glass substrate (1), a layer of semiconducting chalcogenide (3) disposed on the first layer of indium-tin-oxide (2), a layer of complex organic material (4) disposed on the chalcogenide layer (3), a second layer of indium-tin-oxide (5) disposed on the organic material layer (4) and a second layer of amorphous glass substrate (6) disposed on the second layer of indium-tin-oxide layer (5), as presented in FIG. 1.

The photo-conduction is produced in the two inner layers composed by a layer of complex organic (4) and a layer of chalcogenide semiconductor (3) by meaning of the electron transport from organic into chalcogenide material, this solar cell is capable of producing photoactivity under electromagnetic radiation of 100 mW/cm$^2$ with an efficiency of 2.48% and a current density of 6.35 mA/cm$^2$.

In embodiment of the invention, the non-volatile layer of complex aromatic organic compound (4) is a dry solid state, chemically stable at room temperature; flakes of carbon and its derivatives including asphaltenes were diluted in 1:10 ratio in organic toluene solvent to conform a liquid solution-paste with light black aspect color. A first layer of tin-oxide film (2) composed by electrically conductive indium-tin-oxide (ITO) deposit over commercial amorphous glass (1), using raw target material by radio-frequency sputtering at high vacuum 1×10$^{-9}$ Torr to create a layer of 50 nm in thickness. The chalcogenide semiconducting material (3) is composed of molybdenum di-sulfide with chemical formula MoS$_2$, the laminates of this chalcogenide material have a vertical growth over the ITO (2) with average stacking of 20 layers per crystallite and band gap of 1.3 eV [32]. The second layer of ITO (5) over glass substrate (6) serves as cover part of the electrical device as indicated in the FIG. 1.

DETAILED DESCRIPTION OF THE INVENTION

Figure 2:
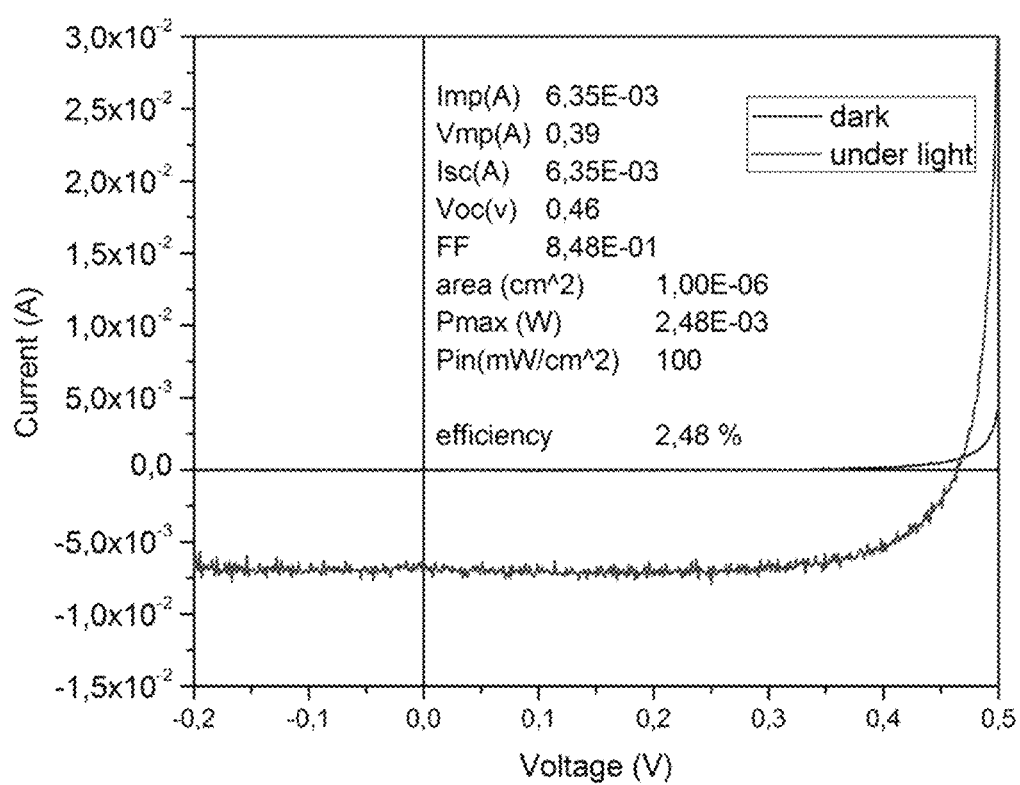
FIG. 2. It is a graph of experimental current-voltage (I-V) data and the performance of solar cells obtained during electromagnetic radiation at 100 mW/cm$^2$.

In accordance to FIG. 2, the photo-conduction can be measured as described elsewhere by using sun simulator electromagnetic radiation test device station. A total of 100 mW/cm$^2$ electromagnetic radiation over device surface was administrated, the invented solar dell each tested device was connected using micromanipulators to electrometer model Keithley 6517A® and data is collected with Omega® scanning card. Data corresponding to power-voltage used during device conversion testing is presented in FIG. 3.

Figure 1:
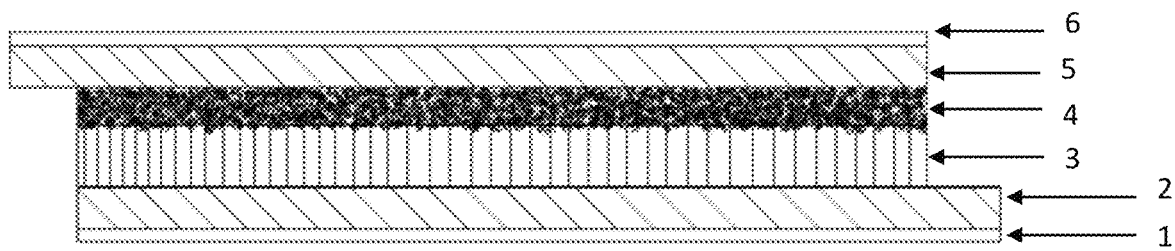
FIG. 1 is a schematic side view of the solar cell of the present invention composed of an amorphous glass substrate (1), an indium-tin-oxide (ITO) layer (2), a layer of molybdenum di-sulfide (MoS$_2$) (3), a layer of complex organic material compound (4), an indium-tin oxide (ITO) layer (5) and an amorphous glass substrate (6).

According to FIG. 1, the layer (1) is a substrate that can be amorphous glass, high temperature plastic acetate or any other solid laminar material, transparent to visible light, able to resist temperatures of up to 300° C. and radiofrequency radiation and exposure to plasma, high energy particles at high vacuum 3 mTorr.

In the embodiment of this invention in accordance to FIG. 1, In the embodiment of this invention according to FIG. 1, the layer (3) is made of a porous layer chalcogenide of semiconductor MoS$_2$~100 nm, is created using radio frequency magnetron sputtering high vacuum system, from commercial 99.9% target material. Chamber was operated at 3 mTorr operating with 13.56 MHz RF power at 275 W, to create a film thickness of ~100 nm, a dwell time of 300 seconds was used during the automated recipe.

The layer of organic material (4) consists of a solid black paste composed by complex aromatic asphaltene-like molecules, were chemical extracted from Mexican crude oil using recommended D2007-80 ASTM procedure. The black solid was diluted in toluene at concentrations of about 0.1 gr for 10 mL (1:10 ratio) to form a light dark liquid solution. The exact chemical composition characterization of black precipitate is beyond the scopes of the invention.

The inventors of the present invention aim to solve above mentioned renewable energy needs and found that using complex aromatic carbon content compounds obtained using D2007-80 ASTM norm is possible to produce a reliable device for solar energy conversion. Then, the present invention is considered as completed. Conforming to the present invention, we are providing evidence of a hybrid or dye-sensitized solar cell device composed by a layer of semiconducting chalcogenide material (3) and a layer organic (4) composed by complex aromatic carbon graphitic-like compound. Which are placed in contact using conductive metal oxide transparent substrates, wherein the electrolyte is retained in a crosslinked polymer compound.

According to the invention, as presented here, a thin layer of indium-tinoxide (ITO) (2), as conductive transparent materials for electrical contacts, is placed on a transparent glass substrate (1) when the solar cell is manufactured, and on this layer of indium-tin-oxide (2) is placed a layer of porous chalcogenide semiconductor material (3) with chemical formula MoS$_2$, known as molybdenum di-sulfide and deposited by a high-vacuum radiofrequency technique, a layer of complex organic material (4) obtained according to the standard norm D2007-80 ASTM and mixed in organic toluene solvent to conform a liquid solution-paste with a light black aspect color and deposit by spin coating over second amorphous glass substrate (6) prepared with a second layer of indium-tin-oxide (ITO) (5) at room temperature and baked at 80° C. for 1 minute to release any solvent residue.

Both substrates (1 and 6) are sandwiched together, the layer of complex organic material (4) and the layer of chalcogenide semiconductor material (3) remaining in direct contact forming a cell arrangement and having sides of each layer exposed with a Indium-tin-oxide (ITO) layer (2 and 5) as contact parts for electrical conductivity tests.

The solar cells were exposed to electromagnetic radiation (100 mW/cm$^2$) in a solar simulator laboratory station for device performance and conversion efficiency, obtaining a value of 2.4% and a current density of 6.35 (mA/cm$^2$).

Figure 3:
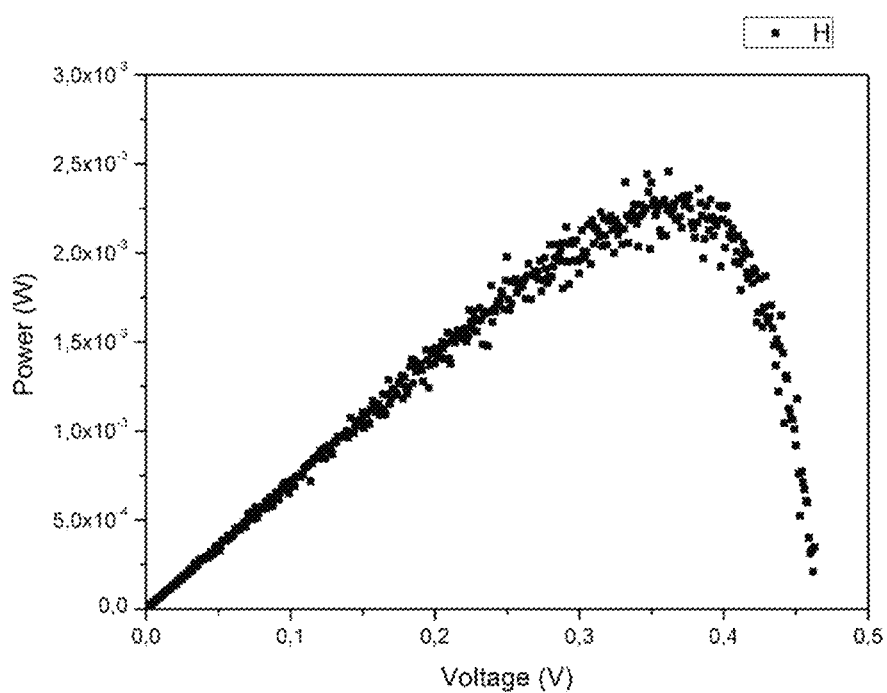
FIG. 3. It is a graph showing the experimental data of electromagnetic radiation power distribution during over solar cell device testing.

All obtained data values are presented in FIGS. 2 and 3 and compared with results as presented in the literature.

The following table shows the increase in efficiency when using the specific combination of the layers according to the solar cell of the present invention.

| Material | $J_{sc}$ (mA/cm$^2$) | $V_{oc}$ (V) | Efficiency (%) | FF |
| --- | --- | --- | --- | --- |
| Au/Mos$_2$ | 5.37 | 0.59 | 1.8 | 0.55 |
| MoS$_2$/PTB7 | 1.98 | 0.21 | 0.1 | 0.21 |
| Asphaltene/CoMoS$_2$ | 0.49 | 0.41 | 0.1 | 0.25 |
| MoS$_2$/p-Si | 3.2 | 0.14 | 1.3 | 0.42 |
| Organic/MoS$_2$ | 6.35 | 0.46 | 2.48 | 0.84 |

Table 1. Current density, voltage, solar efficiency and fill factor on hybrid organic-semiconducting solar cell device for comparison other data is presented.

The main parameters to obtain the performance of solar cells are the short-circuit current $I_{sc}$, the open-circuit voltage $V_{oc}$, and the fill factor FF. These parameters are determined from the dark and illuminated current-voltage (I-V) characteristic, in the following paragraphs are described the main equations and procedures to obtain these parameters for the devices fabricated with Organic/MoS$_2$ solar cell structure, in addition a comparison with the state of the art is presented.

The short-circuit current ($I_{sc}$) is the current that flows through the external circuit when the electrodes of the solar cell are short circuited. The short-circuit current of a solar cell depends on the photon flux density incident on the solar cell, which is determined by the spectrum of the incident light. For a standard solar cell measurement, the standard is the AM1.5 spectrum. The $I_{sc}=(J_{sc}/Area)$ depends on the area of the solar cell, in addition, the maximum current that the solar cell can deliver strongly depends on the optical properties of the solar cell, such as absorption in the absorber layer and reflection.

Open-circuit voltage ($V_{OC}$): The open-circuit voltage is the voltage at which no current flows through the external circuit. It is the maximum voltage that a solar cell can deliver. $V_{oc}$ corresponds to the forward bias voltage, at which the dark current compensates the photocurrent. Voc depends on the photo-generated current density and can be calculated from Eq.

$$V_{OC} = \frac{nkT}{q}\ln\left(\frac{I_L}{I_0}+1\right)$$

Where $I_o$ is the saturation-current of the p-n junction in dark, $I_L$ is the light generated current, n is an ideality factor, k is Boltzmann's constant (k=1.38×10$^{-23}$ J/K). kT is the thermal energy, at 300 K it is 0.0258 eV, q is the electron charge.

Fill factor: The power from the solar cell is zero. The "fill factor" (FF) is the parameter which, in conjunction with $V_{oc}$ and $I_{sc}$, determines the maximum power from a solar cell. The FF is defined as the ratio of the maximum power ($I_{mp}$, $V_{mp}$) from the solar cell to the product of $V_{oc}$ and $I_{sc}$, as is show in following eq. Graphically, the FF is a measure of the "squareness" of the solar cell and is also the area of the largest rectangle which will fit in the I-V curve, as is shown in FIG. 2.

$$FF = \frac{I_{mp} \times V_{mp}}{I_{sc} \times V_{oc}}$$

Determination of FF using $P_{max}$ area: The current voltage characteristic (I-V curve) of a solar cell is the superposition of the I-V curve in the dark with the current generated by light. Illumination shifts the I-V curve down into the fourth quadrant where power can be extracted from the diode. The efficiency of a solar cell (n) is determined as the fraction of incident power which is converted to electricity and the maximum power is given by the following equations: The sample was tested using a standard AM1.5G simulated solar spectrum at 100 mW/cm$^2$ $$\eta = \frac{V_{OC} \times I_{sc} \times FF}{P_{in}}$$

$$P_{max} = V_{oc}I_{sc}FF$$

where $V_{on}$ is the open-circuit voltage, $I_{sc}$ is the short-circuit current; FF is the fill factor and n is the efficiency, respectively.

The measurements were done using an electrometer 6517A Keithley and a solar cell simulator. The samples were measured using a solar simulator (Newport) under steady illumination AM1.5 spectral filter, and the light sensor current (Newport Oriel digital exposure controller, Model 68945) to provide 1 Sun (100 mW/cm$^2$). The I-V curves of all samples were measured using an electrometer with bias voltage from −1 to 1 Volt and using the tips of micromanipulators making a contact to the area of the thin films without any metal-contact deposition. The solar simulator was turned on at least 30 min prior to measurement and calibrated to 1 Sun. Before each measurement the cells were kept at illumination and under dark conditions.

For these measurements and linear behavior was observed in all the samples, a good ohmic contact without any metal-contact is presented, the electrical resistance of the material is around 4 Kohms. All samples were measured under dark and light conditions using an instrument called semiconductor parameter analyzer model 4200-SCS from Keithley. The Model 4200-SCS is an integrated system that includes instruments for making DC and ultra-fast I-V. These I-V characteristics were measured using the Source-Measure Units (SMUs), which can source and measure both current and voltage. Because these SMUs have four-quadrant source capability, they can sink the cell current as a function of the applied voltage, the DC range for this instrument is from −1A to 1A. The range of voltage was from −6V to 6 volts and the measurements were performed under dark conditions and after that the samples were radiated with a visible light (lamp of 100 W) and measured again with the same equipment, the tips of the micromanipulator were put over the samples without any metal contact.

The above mentioned and other specific details of the present invention can become further superficial from a detailed description given elsewhere. Though, it would be understood that complete description of device performance and examples, as indicated or referred embodiments of the invention are provided by meaning of data sets and illustrations; thus, a diverse modification within the core of the present invention are or can be clear solely to skilled individuals with high-background knowledge of the description.

The invention claimed is:

1. An organic-semiconducting hybrid solar cell electrically conductive and light sensitive comprising: A first transparent solid laminar substrate; a first transparent conductive metal oxide layer disposed on the first substrate; a layer of chalcogenide semiconductor material, sensitive to light and exhibiting a porous matrix therein, disposed on the first transparent conductive metal oxide layer; a layer of complex organic material, with a light black color composed of graphitic layers of aromatic carbons, allotropes of carbon and/or combination thereof, disposed on the layer of chalcogenide semiconductor material; a second layer of transparent conductive metal oxide material disposed on the layer of the complex organic material; a second layer of transparent laminar substrate disposed on the second layer of transparent conductive metal oxide material.

2. The organic-semiconducting hybrid solar cell of claim 1, wherein the first transparent solid laminar substrate and the second layer of transparent laminar substrate are constituted by amorphous glass or plastic acetate.

3. The organic-semiconducting hybrid solar cell of claim 1, wherein the transparent conductive metal oxide layers are constituted of indium-tin oxide as electrical contacts.

4. The organic-semiconducting hybrid solar cell of claim 1, wherein the layer of chalcogenide semiconductor material is constituted by molybdenum disulfide ($MoS_2$).

5. The organic-semiconducting hybrid solar cell of claim 1, wherein the layer of complex organic material is a thin layer of about 50 nm and the layer of chalcogenide semiconductor material is about 100 nm.

* * * * *